(12) United States Patent
Cai

(10) Patent No.: US 10,510,986 B2
(45) Date of Patent: Dec. 17, 2019

(54) ENCAPSULATION STRUCTURE FOR FLEXIBLE DISPLAY AND MANUFACTURING METHOD THEREOF

(71) Applicant: Wuhan China Star Optoelectronics Semiconductor Display Technology Co., Ltd., Wuhan, Hubei (CN)

(72) Inventor: Fenghao Cai, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/023,314

(22) Filed: Jun. 29, 2018

(65) Prior Publication Data

US 2019/0252638 A1    Aug. 15, 2019

Related U.S. Application Data

(63) Continuation of application No. PCT/CN2018/078803, filed on Mar. 13, 2018.

(30) Foreign Application Priority Data

Feb. 9, 2018    (CN) .......................... 2018 1 0135114

(51) Int. Cl.
*H01L 51/52*    (2006.01)
*H01L 51/00*    (2006.01)
(Continued)

(52) U.S. Cl.
CPC ...... *H01L 51/5253* (2013.01); *H01L 23/3121* (2013.01); *H01L 23/3192* (2013.01);
(Continued)

(58) Field of Classification Search
None
See application file for complete search history.

(56) References Cited

U.S. PATENT DOCUMENTS

2017/0331073 A1* 11/2017 Choi ................... H01L 51/0096
2018/0019439 A1*  1/2018 Lee ..................... H01L 27/3262
(Continued)

FOREIGN PATENT DOCUMENTS

CN         106876612 A        6/2017

*Primary Examiner* — Cheung Lee
(74) *Attorney, Agent, or Firm* — Leong C. Lei

(57) ABSTRACT

The present invention provides an encapsulation structure for a flexible display having an OLED lighting device on a flexible substrate. The encapsulation structure is disposed on the OLED lighting device, and includes a stack of layers for preventing moist from permeating into the OLED lighting device. The stack of layers includes at least one first organic layer and a plurality of inorganic layers wrapping the at least one first organic layer. Two inorganic layers of the stack of layers have interfacing faces that contact each other and separate the at least one first organic layer into a plurality of independent geometric regions. Through the present invention, moist undergoes an extended path to infiltrate, and is prevented from permeating into and eroding the OLED lighting device through pinholes of the inorganic layers, thereby prolonging the operation life of the OLED lighting device.

10 Claims, 3 Drawing Sheets

(51) Int. Cl.
*H01L 27/32* (2006.01)
*H01L 51/56* (2006.01)
*H01L 23/31* (2006.01)

(52) U.S. Cl.
CPC .......... *H01L 27/32* (2013.01); *H01L 51/0097* (2013.01); *H01L 51/5256* (2013.01); *H01L 51/56* (2013.01)

(56) References Cited

U.S. PATENT DOCUMENTS

2018/0032197 A1* 2/2018 Jin .................... G02F 1/13338
2018/0061910 A1* 3/2018 Cai .................... H01L 27/3223

\* cited by examiner

ENCAPSULATION STRUCTURE FOR FLEXIBLE DISPLAY AND MANUFACTURING METHOD THEREOF

CROSS-REFERENCE TO RELATED APPLICATIONS

This application is a continuing application of PCT Patent Application No. PCT/CN2018/078803, filed on Mar. 13, 2018, which claims priority to Chinese Patent Application No. 201810135114.5, filed on Feb. 9, 2018, both of which are hereby incorporated herein by reference in their entireties.

BACKGROUND OF THE INVENTION

(a) Technical Field of the Invention

The present invention is generally related to display technologies, and more particular to an encapsulation structure for flexible displays and a related manufacturing method.

(b) Description of the Prior Art

In contrast to liquid crystal displays, Organic Light Emitting Diode (OLED) displays, as a new generation display, has many advantages such as self-illumination, fast response, wide viewing angle, high color saturation, etc.

Conventionally, an organic film is firmed on the substrate of OLED lighting device and sandwiched between cathode and anode metallic or conductive layers. When voltage is applied across the cathode and anode, the organic film would be lit. However, moist in the air would cause the oxidation to the cathode's reactive metal and reaction with the organic material, thereby failing the OLED lighting device. Therefore, the effective shielding of the OLED lighting device from moist is vital to the operation life of OLED lighting device.

Usually the OLED lighting device is encapsulated by multiple inorganic layers formed by chemical vapor deposition (CVD) and multiple organic layers formed ink jet method, alternately stacked into an encapsulation structure. However, in the manufacturing process, pinholes may be formed in the inorganic layers, allowing moist to permeate into the OLED lighting device through the organic layers, eroding the OLED lighting device and reducing its operation life.

SUMMARY OF THE INVENTION

The technical issue addressed by the present invention is to provide an encapsulation structure for a flexible display and a related manufacturing method so that moist undergoes an extended path to infiltrate, and is prevented from permeating into and eroding the OLED lighting device through pinholes of the inorganic layers, thereby prolonging the operation life of the OLED lighting device.

To resolve the technical issue, the present invention provides an encapsulation structure for a flexible display having an OLED lighting device on a flexible substrate where the encapsulation structure is disposed on the OLED lighting device.

The encapsulation structure includes a stack of layers for preventing moist from permeating into the OLED lighting device. The stack of layers includes at least one first organic layer and at least two inorganic layers wrapping the at least one first organic layer. Two inorganic layers of the stack of layers have interfacing faces that contact each other and separate the at least one first organic layer into multiple independent geometric regions.

In one embodiment, the stack of layers include one or more first layer sets stacked together. Each first layer set includes two inorganic layers and a first organic layer mapped between the two inorganic layers.

The two inorganic layers of each first layer set have interfacing faces that contact each other and separate the first organic layer into multiple independent geometric regions.

The first organic layer includes multiple independent blocks. Each block has a spindle shape whose cross-sectional area decreases from a middle section towards its two lateral ends.

The first organic layer is made of one of acrylic, epoxy, and silicone.

Each inorganic layer is made of one of silicon nitride, silicon oxide, and silicon oxynitride.

In one embodiment, the encapsulation structure further includes a second organic layer covering the stack of layers.

The second organic layer is made of one of acrylic, epoxy, and silicone.

To resolve the technical issue, the present invention provides another encapsulation structure for a flexible display having an OLED lighting device on a flexible substrate where the encapsulation structure is disposed on the OLED lighting device.

The encapsulation structure includes a stack of layers for preventing moist from permeating into the OLED lighting device. The stack of layers includes at least one first organic layer and at least two inorganic layers wrapping the at least one first organic layer. Two inorganic layers of the stack of layers have interfacing faces that contact each other and separate the at least one first organic layer into multiple independent geometric regions.

The stack of layers include one or more second layer sets stacked together. Each second layer set includes at least two inorganic layers and multiple first organic layers wrapped between two of the inorganic layers.

The two inorganic layers have interfacing faces that contact each other and separate the first organic layers into multiple independent geometric regions.

The first organic layer include multiple independent blocks. Each block has a spindle shape whose cross-sectional area decreases from a middle section towards its two lateral ends.

Each first organic layer is made of one of acrylic, epoxy and silicone.

Each inorganic layer is made of one of silicon nitride, silicon oxide, and silicon oxynitride.

In one embodiment, the encapsulation structure thither includes a second organic layer covering the stack of layers.

The second organic layer is made of one of acrylic, epoxy, and silicone.

To resolve the technical issue, the present invention also provides a manufacturing method of an encapsulation structure for a flexible display. The method includes the following steps.

A flexible substrate is provided, with an OLED lighting device on the flexible substrate.

A first inorganic layer covering the OLED lighting device, a first organic layer having multiple independent geometric regions, and a second inorganic layer covering the first organic layer are sequentially formed on the OLED lighting device on the flexible substrate.

In one embodiment, the manufacturing method further includes the following step.

A second organic layer is firmed on the second inorganic layer.

The first inorganic layer is formed by CVD using one of silicon nitride, silicon oxide, and silicon oxynitride with a thickness between 0.5 um and 20 um.

The first organic layer is formed by inkjet using one of acrylic, epoxy and silicone with a thickness between 20 nm and 200 nm.

The second inorganic layer is formed by CVD using one of silicon nitride, silicon oxide, and silicon oxynitride with a thickness between 0.5 um and 20 um.

The second organic layer is formed by CVD using one of acrylic, epoxy, and silicone with a thickness between 20 nm and 200 nm.

The present invention has the following advantages. In contrast the prior encapsulation structures, the present invention prevents moist from permeating into the flexible display by a stack of layers with organic layers (such as the first organic layer) wrapped in inorganic layers. In the stack of layers, at least an inorganic layer has a face contacting the first organic layer with multiple bulges that separate the first organic layer into multiple independent geometric regions. This will further prevent moist from permeating through the pinholes of inorganic layer and the organic layer into the OLED light device, thereby prolonging the operation life of OLED lighting device.

The foregoing objectives and summary provide only a brief introduction to the present invention. To fully appreciate these and other objects of the present invention as well as the invention itself all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

To make the technical solution of the embodiments according to the present disclosure, a brief description of the drawings that are necessary for the illustration of the embodiments will be given as follows. Apparently the drawings described below show only example embodiments of the present disclosure and for those having ordinary skills in the art, other drawings may be easily obtained from these drawings without paying any creative effort. In the drawings.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
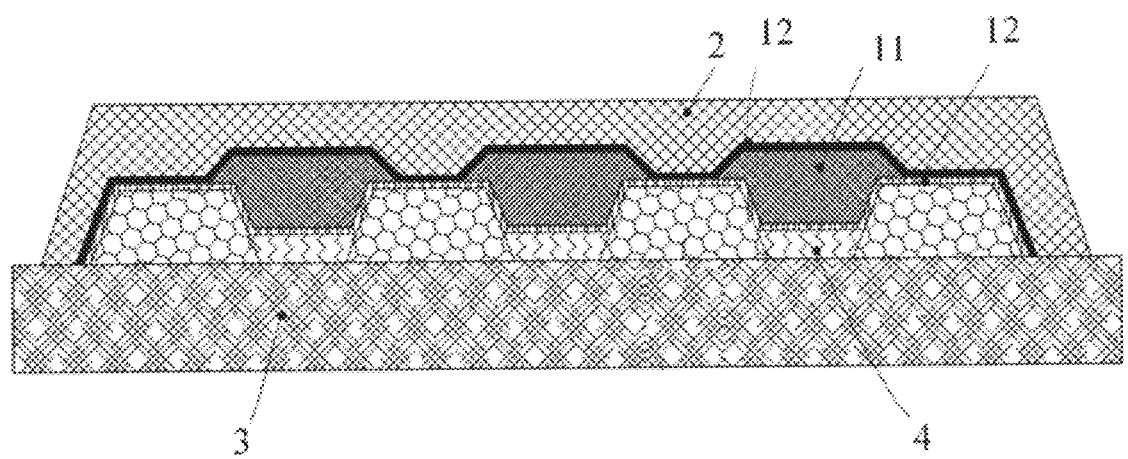
FIG. 1 is a schematic sectional diagram showing an encapsulation structure for a flexible display according to an embodiment of the present invention.

As shown in FIG. 1, an encapsulation structure for a flexible display according an embodiment of the present invention is disposed on an OLED lighting device 4, which in turn is disposed on a flexible substrate 3. The flexible substrate is made of Polyimide (PI), Polyethylene terephthalate (PET), etc.

The encapsulation structure includes a stack of layers involving at least a first organic layer 11 wrapped between at least two inorganic layers 12. The inorganic layers 12 have interfacing faces that contact each other and separate the first organic layer 11 into multiple independent geometric regions.

It should be understandable that, in order to reduce stress to prolong the operation life of the flexible display; a second organic layer 2 may be disposed on and completely covers the inorganic layers 12, including their peripheries.

In the present embodiment, the stack of layers involves at least three layers. Regardless how many first organic layers 11 are includes, the outermost two layers are the inorganic layers 12. The first organic and inorganic layers 11 and 12 may be alternately stacked. Or, alternatively, multiple first organic layers 11 are stacked together and wrapped by one or more inorganic layers 12 from the outside.

In one embodiment, the stack of layers includes one or more first layer sets stacked together. Each first layer set includes two inorganic layers 12 and a first organic layer 11 wrapped between the two inorganic layers 12.

Within each first layer set, the two inorganic layers 12 have interfacing faces that contact each other and the faces jointly separate the first organic layer 11 into multiple independent geometric regions. For example, the first organic layer 11 may be divided into multiple independent blocks, each having a spindle shape whose cross-sectional area decreases from a middle section towards its two lateral ends. The blocks may also have conic, cylindrical, or other shapes.

In another embodiment, the stack of layers may involve one or more second layer sets stacked together. Each second layer set includes at least two inorganic layers 12 and multiple first organic layer 11 wrapped between the two inorganic layers 12. In other words, the multiple first organic layers 11 are stacked together and then altogether wrapped from the outside by one or more layers of inorganic layers 12.

Within each second layer set, the two inorganic layers 12 have interfacing faces that contact each other and the faces jointly separate the wrapped multiple first organic layers 11 into multiple independent geometric regions. For example, the first organic layers 11 may be divided into multiple independent blocks, each having a spindle shape whose cross-sectional area decreases from a middle section towards its two lateral ends. The blocks may also have conic, cylindrical, or other shapes.

Figure 2:
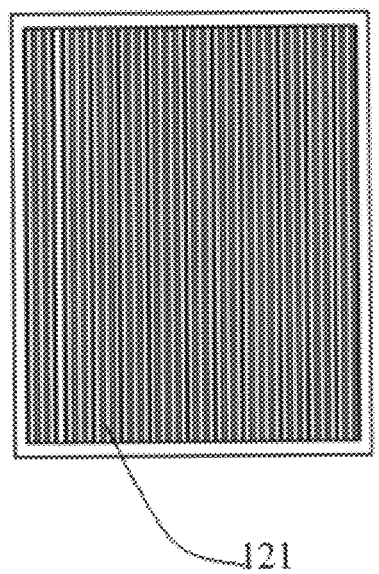
FIG. 2 is a schematic planar diagram showing a first inorganic layer of an encapsulation structure for a flexible display according to an embodiment of the present invention.
Figure 3:
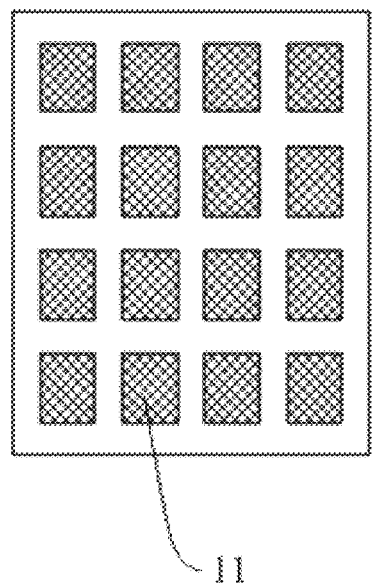
FIG. 3 is a schematic planar diagram showing a first organic layer of an encapsulation structure for a flexible display according to an embodiment of the present invention.
Figure 4:
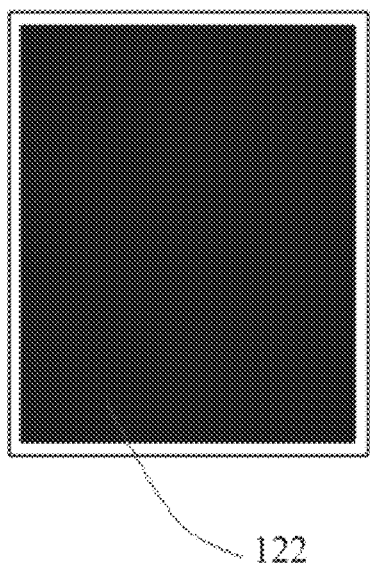
FIG. 4 is a schematic planar diagram showing a second inorganic layer of an encapsulation structure for a flexible display according to an embodiment of the present invention.
Figure 5:
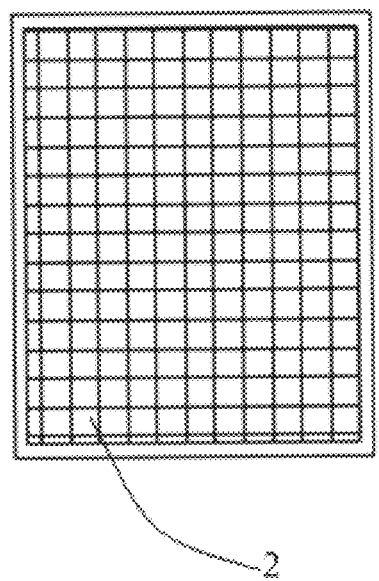
FIG. 5 is a schematic planar diagram showing a second organic layer of an encapsulation structure for a flexible display according to an embodiment of the present invention.

As shown in FIGS. 2 to 5, in a scenario of applying an embodiment of the present invention to a flexible display, the layer of stacks has three layers. Depending on their locations, the inorganic layer 12 beneath the first organic layer 11 (as shown in FIG. 2) is referred to as a first inorganic layer 121 (as shown in FIG. 3) and the inorganic layer 12 above the first organic layer 11 is referred to as a second inorganic layer 122 (as shown in FIG. 4). After stacking, the second organic layer 2 is disposed on the second inorganic layer 122 (as shown in FIG. 5).

Figure 6:
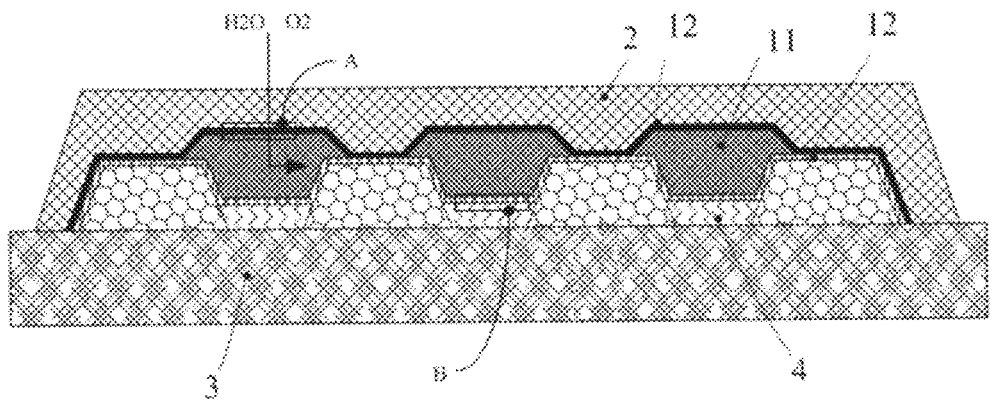
FIG. 6 is a schematic diagram showing how an encapsulation structure for a flexible display according to an embodiment of the present invention prevents moist from permeating into the flexible display.

Therefore, regardless of the stack structure, as long as there are two inorganic layers 12 wrapping and separating the first organic layer 11 into multiple independent geometric regions, the moist outside the top and bottom opposing inorganic layers 12 is maximally guaranteed to permeate into different geometric regions of the first organic layer 11. The infiltration of moist will undergo an extended path and therefore the operation life of the flexible display is prolonged. As shown in FIG. 6, the moist may permeate through the second organic layer 2 and a pinhole A on the top inorganic layer 12. The bottom inorganic layer 12 has a pinhole B not in the same geometric region as the pinhole A. Therefore the moist entering through the pinhole A cannot continue to permeate through the pinhole B. The moist therefore suffers an extended permeating path and therefore may be effectively blocked.

In the present embodiment, the first and second organic layers 11 and 2 are made of one of acrylic, epoxy and silicone. The inorganic layer 12 is made of one of silicon nitride, silicon oxide, and silicon oxynitride.

Figure 7:
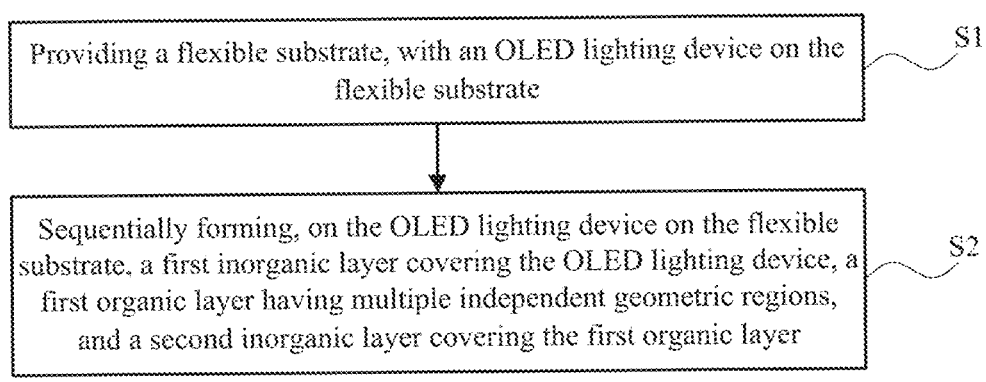
FIG. 7 is a flow diagram showing a manufacturing method of an encapsulation structure for a flexible display according to an embodiment of the present invention.

For the encapsulation structure described above, a corresponding manufacturing method according to an embodiment of the present invention is shown in FIG. 7. The manufacturing method includes the following steps.

In stun S1, a flexible substrate is provided, with an OLED lighting device on the flexible substrate.

In step S2, a first inorganic layer covering the OLED lighting device, a first organic layer having multiple independent geometric regions, and a second inorganic layer covering the first organic layer are sequentially formed on the flexible substrate.

Specifically; the first inorganic layer is formed by CVD using one of silicon nitride, silicon oxide, and silicon oxynitride with a thickness between 0.5 um and 20 um. The first organic layer is formed by inkjet using one of acrylic, epoxy and silicone with a thickness between 20 nm and 200 nm. The second inorganic layer is formed by CVD using one of silicon nitride, silicon oxide, and silicon oxynitride with a thickness between 0.5 um and 20 um.

It should be noted that the first inorganic layer, the first organic layer, and the second inorganic layer may all have a single-layer structure or a multi-layer structure.

The manufacturing method may further includes the following step.

A second organic layer is formed on the second inorganic layer by CVD using one of acrylic, epoxy; and silicone with a thickness between 20 nm and 200 nm.

The present invention as described above has the following advantages. In contrast the prior encapsulation structures, the present invention prevents moist from permeating into the flexible display by a stack of layers with organic layers (such as the first organic layer) wrapped in inorganic layers. In the stack of layers, at least an inorganic layer has a face contacting the first organic layer with multiple bulges that separate the first organic layer into multiple independent geometric regions. This will further prevent moist from permeating through the pinholes of inorganic layer and the organic layer into the OLED light device, thereby prolonging the operation life of OLED lighting device.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

I claim:

1. An encapsulation structure for a flexible display having an OLED lighting device on a flexible substrate, the encapsulation structure disposed on the OLED lighting device, comprising a stack of layers for preventing moist from permeating into the OLED lighting device; wherein the stack of layers comprising at least one first organic layer and at least two inorganic layers wrapping the at least one first organic layer; and two inorganic layers of the stack of layers have interfacing faces that contact each other and separate the at least one first organic layer into a plurality of independent geometric regions; wherein the stack of layers comprise one or more first layer sets stacked together; each first layer set comprises two inorganic layers and a first organic layer wrapped between the two inorganic layers; and the two inorganic layers of each first layer set have interfacing faces that contact each other and separate the first organic layer into a plurality of independent geometric regions; wherein the first organic layer comprises a plurality of independent blocks; each block has a spindle shape whose cross-sectional area decreases from a middle section towards its two lateral ends.

2. The encapsulation structure according to claim 1, wherein the first organic layer is made of one of acrylic, epoxy, and silicone.

3. The encapsulation structure according to claim 2, wherein each inorganic layer is made of one of silicon nitride, silicon oxide, and silicon oxynitride.

4. The encapsulation structure according to claim 3, further comprising a second organic layer covering the stack of layers.

5. The encapsulation structure according to claim 4, wherein the second organic layer is made of one of acrylic, epoxy, and silicone.

6. An encapsulation structure for a flexible display having an OLED lighting device on a flexible substrate, the encapsulation structure disposed on the OLED lighting device, comprising a stack of layers for preventing moist from permeating into the OLED lighting device; wherein the stack of layers comprising at least one first organic layer and at least two inorganic layers wrapping the at least one first organic layer; two inorganic layers of the stack of layers have interfacing faces that contact each other and separate the at least one first organic layer into a plurality of independent geometric regions; the stack of layers comprise one or more second layer sets stacked together; each second layer set comprises at least two inorganic layers and a plurality of first organic layers wrapped between two of the inorganic layers; and the two inorganic layers have interfacing faces that contact each other and separate the first organic layers into a plurality of independent geometric regions, wherein the first organic layers comprise a plurality of independent blocks; each block has a spindle shape whose cross-sectional area decreases from a middle section towards its two lateral ends.

7. The encapsulation structure according to claim 6, wherein each first organic layer is made of one of acrylic, epoxy, and silicone.

8. The encapsulation structure according to claim 7, wherein each inorganic layer is made of one of silicon nitride, silicon oxide, and silicon oxynitride.

9. The encapsulation structure according to claim 8, further comprising a second organic layer covering the stack of layers.

10. The encapsulation structure according to claim 9, wherein the second organic layer is made of one of acrylic, epoxy, and silicone.

\* \* \* \* \*